(12) United States Patent
Song

(10) Patent No.: US 10,121,934 B2
(45) Date of Patent: Nov. 6, 2018

(54) METHOD FOR MANUFACTURING SEMICONDUCTOR LIGHT EMITTING DEVICE PACKAGE

(71) Applicant: Samsung Electronics Co., Ltd., Suwon-si (KR)

(72) Inventor: Jong Sup Song, Suwon-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 47 days.

(21) Appl. No.: 14/963,269

(22) Filed: Dec. 9, 2015

(65) Prior Publication Data
US 2016/0172533 A1 Jun. 16, 2016

(30) Foreign Application Priority Data
Dec. 12, 2014 (KR) .......................... 10-2014-0179326

(51) Int. Cl.
*H01L 33/00* (2010.01)

(52) U.S. Cl.
CPC .. *H01L 33/0095* (2013.01); *H01L 2933/0041* (2013.01)

(58) Field of Classification Search
CPC ......... H01L 33/0095; H01L 2933/0041; H01L 2933/0033; H01L 33/50–33/508; H01L 33/54; H01L 2933/005; H01L 33/52; H01L 33/56
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| JP | 2001-077429 A | 3/2001 |
| JP | 2002-208730 A | 7/2002 |

(Continued)

*Primary Examiner* — Julio J Maldonado
*Assistant Examiner* — Stanetta Isaac
(74) *Attorney, Agent, or Firm* — Muir Patent Law, PLLC

(57) ABSTRACT

There is provided a method for manufacturing a semiconductor light emitting device package including steps of disposing a plurality of light emitting structures on a support substrate, each light emitting structure including a first conductivity-type semiconductor layer, an active layer, and a second conductivity-type semiconductor layer, shaping a mixture containing a wavelength conversion material and a glass composition on the plurality of light emitting structures, sintering the mixture to form a wavelength conversion part, removing the support substrate, and cutting the plurality of light emitting structures into individual device units.

20 Claims, 13 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,589,358 B2 | 9/2009 | Dwilinski et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,445,929 B2 | 5/2013 | Krames et al. |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2011/0121732 A1* | 5/2011 | Tsutsumi ............ F21S 48/1159 315/77 |
| 2013/0236997 A1* | 9/2013 | Lee .................... H01L 33/48 438/27 |
| 2014/0167605 A1 | 6/2014 | Park et al. |
| 2014/0264412 A1* | 9/2014 | Yoon .................... H01L 33/504 257/98 |
| 2015/0008816 A1* | 1/2015 | Yoon .................... C09K 11/025 313/503 |
| 2015/0187999 A1 | 7/2015 | Song et al. |
| 2015/0194579 A1* | 7/2015 | Chung ................ C09K 11/08 257/98 |
| 2015/0340574 A1* | 11/2015 | Tamaki ................ H01L 33/505 257/98 |

FOREIGN PATENT DOCUMENTS

| | | |
|---|---|---|
| JP | 2004-253743 A | 9/2004 |
| JP | 2008-277447 A | 11/2008 |
| JP | 2014-139979 A | 7/2014 |
| KR | 10-2005-0034812 A | 4/2005 |
| KR | 10-2011-0108625 A | 10/2011 |

* cited by examiner

A – A'

METHOD FOR MANUFACTURING SEMICONDUCTOR LIGHT EMITTING DEVICE PACKAGE

CROSS-REFERENCE TO RELATED APPLICATION

This application claims priority under 35 U.S.C. § 119 to Korean Patent Application No. 10-2014-0179326 filed on Dec. 12, 2014, with the Korean Intellectual Property Office, the entire disclosure of which is incorporated herein by reference.

TECHNICAL FIELD

The present inventive concept relates to a wavelength conversion part containing a glass composition and to a method for manufacturing a semiconductor light emitting device package.

BACKGROUND

A light emitting diode (LED) is a device including a material emitting light when electrical energy is applied thereto, in which energy generated through electron-hole recombination in semiconductor junction parts is converted into light to be emitted therefrom. LEDs are commonly employed as light sources in illumination devices, display devices, and the like, and thus, the development of LEDs has been accelerated.

In particular, as the development and employment of LEDs has recently increased, mobile keypads, turn signal lamps, camera flashes, and the like, using such LEDs, have been commercialized, and, in line with this, the development of general illumination devices using LEDs has accelerated. Like the products to which they are applied, such as the backlight units of large TVs, the headlamps of vehicles, general illumination devices, and the like, the applications of light emitting devices are gradually moving toward large-sized products having high outputs and high degrees of efficiency, and thus, the applications thereof have expanded.

Thus, reduction of manufacturing costs and manufacturing time is helpful for mass production of semiconductor light emitting device packages.

SUMMARY

An aspect of the present inventive concept may provide a method for reducing manufacturing costs and a manufacturing time of a semiconductor light emitting device package.

According to an aspect of the present inventive concept, a method for manufacturing a semiconductor light emitting device package may include: disposing a plurality of light emitting structures, each including a first conductivity-type semiconductor layer, an active layer, and a second conductivity-type semiconductor layer on a support substrate, shaping a mixture containing a wavelength conversion material and a glass composition on the plurality of light emitting structures, sintering the mixture to form a wavelength conversion part, removing the support substrate, and cutting the plurality of light emitting structures into individual device units.

The glass composition may be prepared by adding at least one component selected from the group consisting of $Na_2O$, $CaO$, $K_2O$, and $Li_2O$ to a $ZnO$—$BaO$—$SiO_2$—$P_2O_5$—$B_2O_3$-based glass material.

In the shaping of the mixture, the mixture may be disposed on the plurality of light emitting structures in the form of a sheet.

The method may further include: reducing the thickness of the mixture disposed on the plurality of light emitting structures to a predetermined thickness.

The mixture may be disposed in a manner in which a plurality of sheets are stacked.

The plurality of sheets may contain different wavelength conversion materials from each other.

In the shaping of the mixture, the mixture may fill to cover the sides of the plurality of light emitting structures.

In the cutting of the plurality of light emitting structures, the wavelength conversion part may be cut such that the sides of the active layer are not exposed.

The method may further include: forming an irregular pattern on a surface of the mixture using a mold, before the forming of the wavelength conversion part by sintering the mixture.

The method may further include: forming an irregular pattern on surfaces of the plurality of light emitting structures, before the shaping of the mixture containing the wavelength conversion material and the glass composition on the plurality of light emitting structures.

The method may further include: stacking the plurality of light emitting structures, each including the first conductivity-type semiconductor layer, the active layer, and the second conductivity-type semiconductor layer on a growth substrate, before the disposing of the plurality of light emitting structures including the first conductivity-type semiconductor layer, the active layer, and the second conductivity-type semiconductor layer on the support substrate.

The method may further include: separating the growth substrate from the plurality of light emitting structures, before the forming of the wavelength conversion part by sintering the mixture.

In the separating of the growth substrate from the plurality of light emitting structures, the growth substrate may be separated from the first conductivity-type semiconductor layers.

According to another aspect of the present inventive concept, a method for manufacturing a semiconductor light emitting device package may include: disposing a plurality of light emitting structures, each including a first conductivity-type semiconductor layer, an active layer, and a second conductivity-type semiconductor layer on a support substrate; shaping a mixture containing a wavelength conversion material and a glass composition on one surfaces of the plurality of light emitting structures; removing the support substrate from the plurality of light emitting structures; and removing at least portions of the light emitting structures to separate the light emitting structures.

The disposing of the plurality of light emitting structures on the support substrate may include: forming the plurality of light emitting structures on a growth substrate, forming first and second electrodes on first surfaces of the plurality of light emitting structures on which the second conductivity-type semiconductor layers are formed, such that the first and second electrodes are connected to the first and second conductivity-type semiconductor layers, respectively, attaching the support substrate to the first surfaces of the plurality of light emitting structures, and removing the growth substrate.

In one embodiment of this disclosure, an electronic device comprises a light emitting structure comprising a first conductivity-type semiconductor layer, an active layer, and a second conductivity-type semiconductor layer sequentially stacked on a package board, and a first layer formed on the second conductivity-type semiconductor layer, wherein the first layer comprises homogenous mixture of a glass composition and a wavelength conversion material.

The first layer may comprise at least on of $Na_2O$, $CaO$, $K_2O$, and $Li_2O$. The wavelength conversion material may be configured to convert at least a portion of the light emitted from the light emitting structure into green, yellow, or red light having a different wavelength of the light emitted from the light emitting structure.

The electronic device may further comprises an image display panel configured to use the converted light as a light source. The electronic device may include a convex lens formed over the first layer to adjust the path of the converted light.

In one embodiment, an electronic device includes a light emitting structure comprising a first conductivity-type semiconductor layer, an active layer, and a second conductivity-type semiconductor layer sequentially stacked on a package board, and a first layer formed on the second conductivity-type semiconductor layer, wherein the first layer includes a wavelength conversion material, and the hardness of the first layer is within the range between 0.2 and 7 in Mohs Scale.

The first layer may include a homogenous layer comprising a glass composition or plastic material. The wavelength conversion material may be a green phosphor, a yellow phosphor, or a red phosphor.

The electronic device may include an electronic circuit configured to control electric current applied to the light emitting structure, and a heat dissipation unit configured to dissipate heat generated from the light emitting structure. The electronic device may include a display panel configured to use the converted light as a light source.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1A:
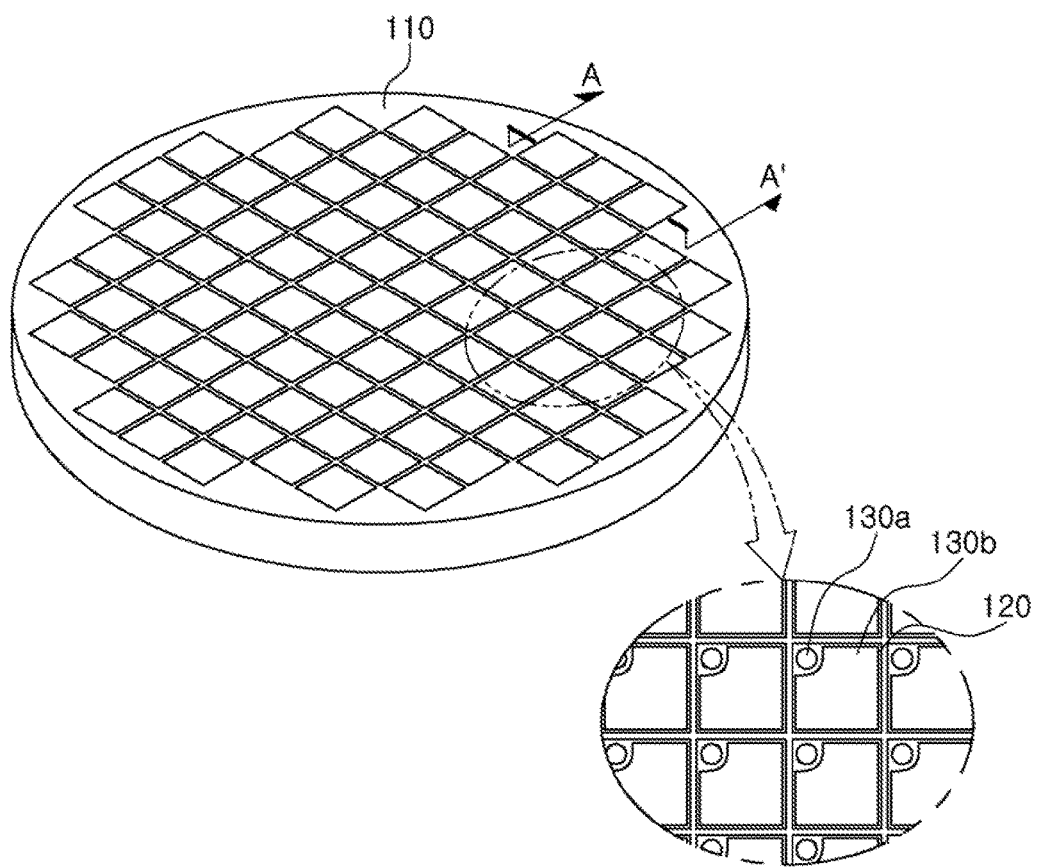
FIGS. 1A through 8 are views schematically illustrating processes in a method for manufacturing a semiconductor light emitting device package according to an exemplary embodiment of the present inventive concept.
Figure 1B:
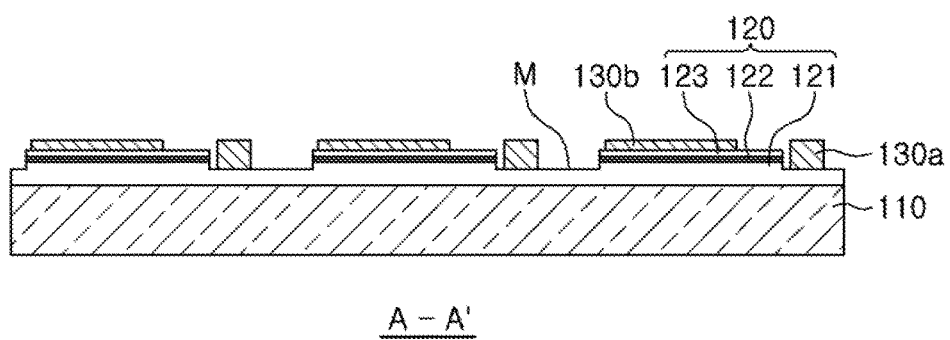

Various embodiments will now be described more fully with reference to the accompanying drawings in which some embodiments are shown. The present disclosure may, however, be embodied in different forms and should not be construed as limited to the embodiments set forth herein. Rather, these embodiments are just that —examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a semiconductor device may refer to any of the various devices such as shown in FIGS. 1B-19, and may also refer, for example, to a device such as a light emitting diode (LED), a semiconductor chip, a stack of semiconductor chips, and a semiconductor package including one or more semiconductor chips stacked on a package substrate. These devices may be formed using electrical connection elements, and may include memory devices such as volatile or non-volatile memory devices.

An electronic device, as used herein, may refer to these semiconductor devices, but may additionally include products that include these devices, such as a liquid crystal device (LCD), a memory module, memory card, hard drive including additional components, or a mobile phone, laptop, tablet, desktop, camera, LED light bulb, LED head lamp, or other consumer electronic device, etc.

It should be noted that functions or operations described in a particular block of a flowchart may occur differently from the flow shown in the flowchart. For example, two consecutive blocks may be performed simultaneously, or the blocks may be performed in reverse according to related functions or operations.

Methods for manufacturing a semiconductor light emitting device package realized on the wafer level are described as examples, but the present inventive concept is not limited thereto.

First, as illustrated in FIG. 1A, a light emitting structure 120 including a first conductivity-type semiconductor layer 121, an active layer 122, and a second conductivity-type semiconductor layer 123 may be formed on a growth substrate 110.

The growth substrate 110 may be provided as a semiconductor growth substrate and may be formed of an insulating, a conductive, or a semiconductive material such as sapphire, SiC, MgAl$_2$O$_4$, MgO, LiAlO$_2$, LiGaO$_2$, or GaN. Sapphire is a crystal having Hexa-Rhombo R3c symmetry, and has a lattice constant of 13,001 Å on a c-axis and a lattice constant of 4,758 Å on an a-axis. Sapphire has a C(0001) plane, an A(11-20) plane, and an R(1-102) plane. In this case, the C plane is mainly used as a nitride growth substrate because it facilitates the growth of a nitride thin film and is stable at high temperatures. When the growth substrate 110 is formed of silicon (Si), it may be more appropriate for increasing a diameter and is relatively low in price, facilitating mass-production. Although not shown, before the light emitting structure 120 is formed, a buffer layer may be formed on a surface on which the first conductivity-type semiconductor layer 121 grows.

The light emitting structure 120 may be formed by sequentially stacking the first conductivity-type semiconductor layer 121, the active layer 122, and the second conductivity-type semiconductor layer 123 on the growth substrate 110.

The first and second conductivity-type semiconductor layers 121 and 123 may be formed of nitride semiconductor, for example, semiconductor materials respectively doped with an n-type impurity and a p-type impurity having an empirical formula of Al$_x$In$_y$Ga$_{(1-x-y)}$N, where 0≤x<1, 0≤y<1, and 0≤x+y<1, and the nitride semiconductor may be typically GaN, AlGaN, or InGaN. Silicon (Si), germanium (Ge), selenium (Se), tellurium (Te), and/or the like, may be used as the n-type impurity, and manganese (Mg), zinc (Zn), beryllium (Be), and/or the like, may be used as the p-type impurity. The first and second conductivity-type semiconductor layers 121 and 123 may be grown using a process such as metal organic chemical vapor deposition (MOCVD), hydride vapor phase epitaxy (HVPE), or molecular beam epitaxy (MBE). In an exemplary embodiment, the first and second conductivity-type semiconductor layers 121 and 123 may be formed of GaN and, here, the first and second conductivity-type semiconductor layers 121 and 123 may be formed on the growth substrate 110 using silicon (Si) as described above.

A mesa region M may be formed in a region of the light emitting structure 120. The mesa region M refers to a region of the first conductivity-type semiconductor layer 121 exposed by mesa etching, and the mesa region M may be used as an isolation region. The mesa region M may be formed using an appropriate etching process such as inductive coupled plasma reactive ion etching (ICP-RIE), or the like.

First and second electrodes 130a and 130b may be formed on the first and second conductivity-type semiconductor layers 121 and 123, respectively. In particular, the first electrode 130a may be disposed in the mesa region M of the first conductivity-type semiconductor layer 121 exposed by etching a portion of the light emitting structure 120. Also, the first and second electrodes 130a and 130b may be disposed to be exposed toward a surface on which a support substrate 150 is to be attached in a subsequent process. The first and second electrodes 130a and 130b may have different shapes and may be disposed to be spaced apart from each other. However, the first and second electrodes 130a and 130b are not limited to the shapes and dispositions illustrated in FIG. 1B.

The first and second electrodes 130a and 130b may include a material such as silver (Ag), nickel (Ni), aluminum (Al), rhodium (Rh), palladium (Pd), iridium (Ir), magnesium (Mg), zinc (Zn), platinum (Pt), or gold (Au), and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt.

In some exemplary embodiments, the other surface of the growth substrate 110, opposing the surface on which the light emitting structure 120 is grown, may be micro-polished through chemical mechanical polishing (CMP) to reduce the thickness of the growth substrate 110. Here, CMP refers to a method of smoothing a surface of a subject to be processed, through a complex mechanical/chemical action. However, the present inventive concept is not limited thereto. For example, a method of partially etching the other surface of the growth substrate 110 may be applied, or when the thickness of the growth substrate 110 is sufficiently thin, the thickness reducing process may be omitted.

In some exemplary embodiments, an oxide layer is formed on the light emitting structure 120 to cover the first and second electrodes 130a and 130b, and a surface of the oxide layer may be planarized to facilitate bonding of the support substrate 150 in a subsequent process.

Figure 2:
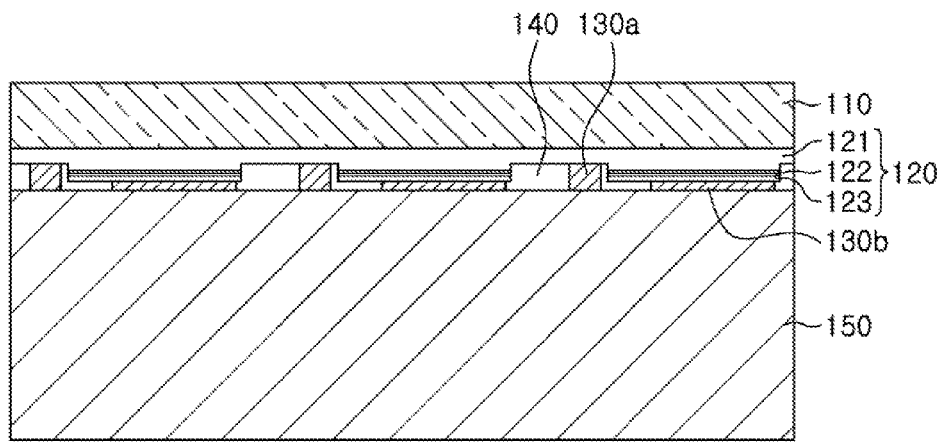

Thereafter, as illustrated in FIG. 2, the support substrate 150 may be attached to a lower surface of the light emitting structure 120, namely, on the surface on which the first and second electrodes 130a and 130b are formed. Here, an adhesive 140 may be applied to the surface of the light emitting structure 120 to which the support substrate 150 is attached.

The support substrate 150 may support the light emitting structure 120 in a subsequent process of separating the growth substrate 110 from the light emitting structure 120. The light emitting structure 120 is a thin semiconductor layer, very vulnerable to external impacts. Thus, the light emitting structure 120 is strengthened with the additional support such as the support substrate 150, and the growth substrate 110 is separated, thereby preventing damage to the light emitting structure 120.

Figure 3:
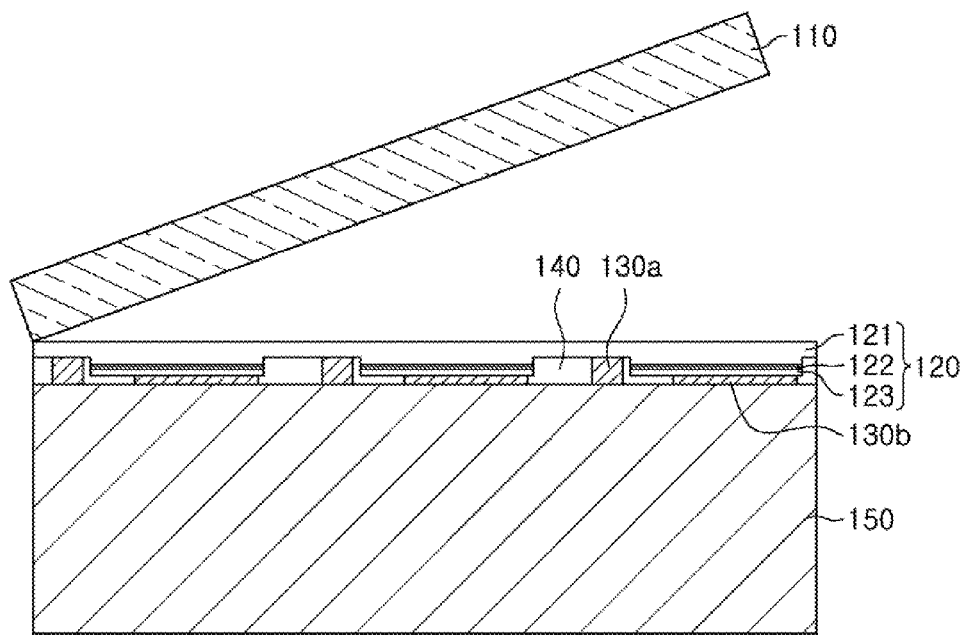

Thereafter, as illustrated in FIG. 3, the growth substrate 110 may be separated from the light emitting structure 120.

The growth substrate 110 may be separated from the light emitting structure 120 through a laser lift-off (LLO) process. A laser used in the LLO process may be one among a 193 nm excimer laser, a 248 nm excimer laser, a 308 nm excimer laser, an Nd:YAG laser, an He—Ne laser, and an argon (Ar) ion laser.

Figure 4:
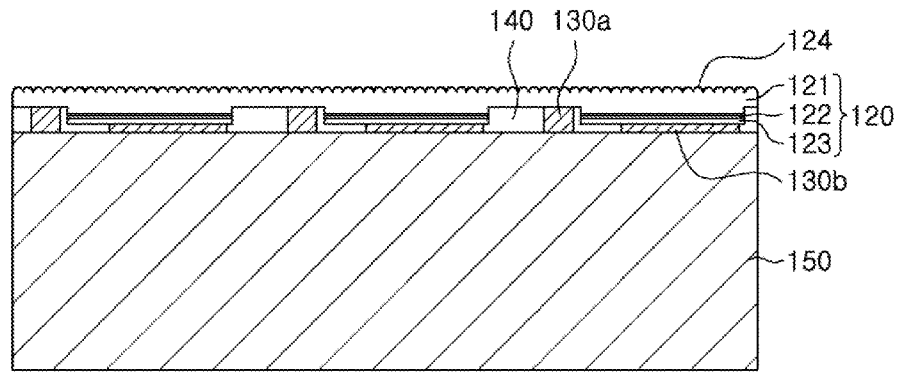

Thereafter, as illustrated in FIG. 4, an irregular pattern 124 may be formed on an exposed surface of the light emitting structure 120. The irregular pattern 124 may be formed on an upper surface of the light emitting structure 120, for example, on the surface from which the growth substrate 110 was separated in a previous process. Due to the irregular pattern 124, light extraction efficiency of the light emitting structure 120 may be enhanced. In the present exemplary embodiment, FIG. 4 shows that the irregular pattern 124 has a dome-shaped convex shape, but the shape of the irregular pattern 124 is not limited thereto. For example, the irregular pattern 124 may have various shapes such as a quadrangular pyramidal shape or a triangular pyramidal shape. In some embodiments, the irregular pattern 124 may be selectively formed and provided. For example, the irregular pattern 124 may be formed on a selected portion of the surface of the light emitting structure 120. In certain embodiments, the irregular pattern 124 may be omitted.

Figure 5:
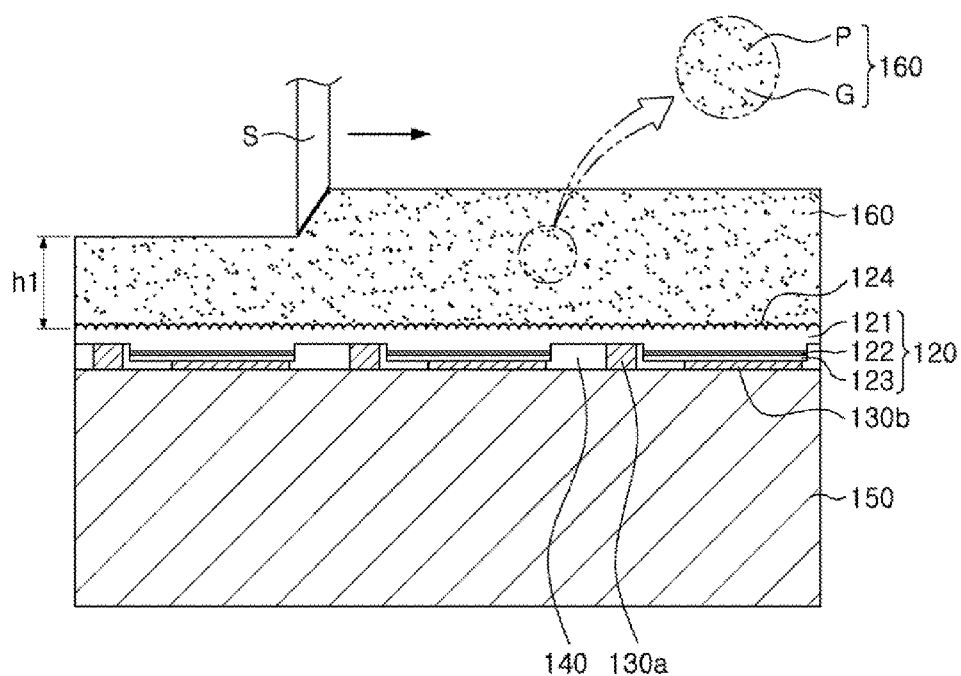

Thereafter, as illustrated in FIG. 5, a mixture layer 160 containing a wavelength conversion material P and a glass composition G may be formed on the light emitting structure 120.

Forming of the mixture layer 160 may include preparing a mixture containing the wavelength conversion material P and the glass composition G, stacking the mixture on the light emitting structure 120, and shaping the same.

As the glass composition G contained in the mixture, a glass material that may be easily sintered at low temperature and obtain a relatively high degree of transmittance may be used. For example, as such a glass material, ZnO—BaO—SiO$_2$—P$_2$O$_5$—B$_2$O$_3$—based glass may be used, and at least one alkali or alkaline earth component selected from the group consisting of Na$_2$O, CaO, K$_2$O, and Li$_2$O may be further contained in the glass composition G. In the composition, SiO$_2$ and B$_2$O$_3$ may be added to the glass material including ZnO, BaO and P$_2$O$_5$ to stabilize a phase. The sintering temperature may be lowered by adding at least one of the foregoing alkali or alkaline earth components to the glass material.

The foregoing glass composition G may contain 30 wt % to 60 wt % of ZnO—BaO, 5 wt % to 25 wt % of SiO$_2$, 10 wt % to 30 wt % of B$_2$O$_3$, 5 wt % to 20 wt % of P$_2$O$_5$ with respect to the gross weight of the glass composition G, and may additionally contain 20 wt % or less of at least one selected from the group consisting of Na$_2$O, CaO, K$_2$O, and Li$_2$O, but the present inventive concept is not limited thereto.

In order to satisfy the composition conditions of the glass composition G, a source material of each component may be a carbonate, an oxide, and/or the like, before being sintered. For example, BaO, Na$_2$O, K$_2$O, and Li$_2$O may be used as BaCO$_3$, Na$_2$CO$_3$, K$_2$CO$_3$, Li$_2$CO$_3$, respectively. Also, the source materials may also be used as a compound of complex components, rather than as a compound of a single component, before being sintered. For example, with respect to ZnO and P$_2$O$_5$, at least portions thereof may be used as Zn$_3$PO$_4$.

The glass composition G may be mixed together with the wavelength conversion material P and a binder in a solvent to form a mixture for a wavelength conversion part 160a.

The wavelength conversion material P may be a phosphor, a quantum dot, and/or the like. For example, the wavelength conversion material P may be a ceramic phosphor. The ceramic phosphor may include one selected from the group consisting of a green phosphor, a yellow phosphor, and a red phosphor.

The red phosphor (for example, a nitride-based phosphor) may have low thermal stability, which may be easily degenerated at high temperatures. However, in the present exemplary embodiment, since the foregoing glass composition G is sintered at a temperature equal to or lower than about 750° C., the problem of degeneration of the red phosphor during sintering may be reduced. As a red nitride phosphor, MAlSiN$_x$:Eu(1≤x≤5) and/or M$_2$Si$_5$N$_8$:Eu may be used. Here, M is at least one of barium (Ba), strontium (Sr), calcium (Ca), and magnesium (Mg).

The binder may serve to bond the glass composition G and the wavelength conversion material P, and it may be at least one organic binder selected from the group consisting of a cellulose resin, an acrylic resin, butylcarbitol, and terpineol, but the present inventive concept is not limited thereto.

Thereafter, the mixture may be stacked on the light emitting structure and shaped to form the mixture layer 160.

In general, the shaping process may be a process of applying the mixture having a sheet shape to the light emitting structure 120. In this case, a jet printing method may be used to discharge the mixture through a nozzle to apply the mixture to the light emitting structure 120, but application of the mixture to the light emitting structure 120 is not limited thereto and various printing methods such as, for example, screen printing may also be used. In order to convert light emitted from the active layer 122 to a light having a desired wavelength, the length of a wavelength conversion path, the distance at which light passes through the wavelength conversion part is important. The length of the wavelength conversion path may be adjusted by appropriately setting the thickness of the wavelength conversion part. The thickness of the wavelength conversion part may be adjusted by appropriately setting the thickness h1 of the mixture layer 160. The thickness h1 of the mixture layer 160 may be adjusted by precisely controlling an application amount of the mixture, and here, the thickness h1 of the mixture layer 160 may be adjusted by using a squeegee S as necessary. During this process, the surface of the mixture layer 160 may be planarized. Also, in addition to the method of applying the mixture, the mixture layer 160 may be formed by shaping the mixture using an appropriate stamp (or a mold). This will be described in another exemplary embodiment. The thickness h1 of the mixture layer 160 may constitute at least half of the thickness of the subsequently formed light emitting devices 100 (see FIG. 7, e.g.). For example, the thickness h1 may be greater than 1×, 1.5× or 2× than the thickness of light emitting structure 120. In some examples, the thickness h1 is greater than 3× than the thickness of light emitting structure 120.

Figure 6:
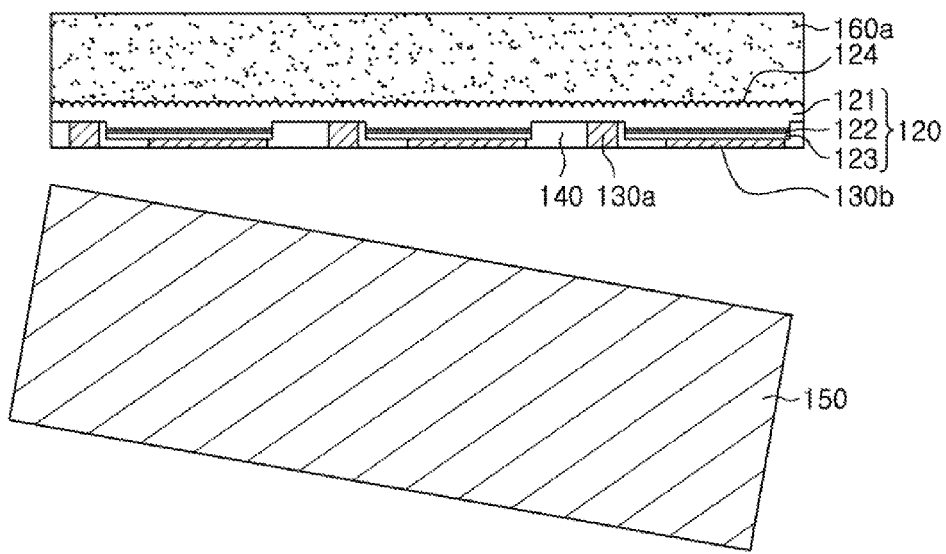

Thereafter, as illustrated in FIG. 6, the mixture layer 160 is sintered at low temperatures to form a wavelength conversion part 160a having a desired shape, and the support substrate 150 may be subsequently removed.

The sintering of the mixture layer 160 may be performed at low temperatures at which the wavelength conversion material P is not degraded. The sintering process may be performed at a temperature equal to or lower than about 750° C. for about 30 minutes according to the composition of the glass composition G forming the mixture layer 160. However, the glass composition G may be difficult to sinter at a temperature lower than about 300° C., and thus, preferably, the sintering process is performed in a temperature range from about 300° C. to about 750° C. Also during the sintering process, pressure (about 20 bar) may be applied to the mixture layer 160 to remove bubbles included in the mixture layer 160.

In order to process the wavelength conversion part 160a to have a desired thickness or in order to smooth the surface of the wavelength conversion part 160a (i.e., in order to make the surface of the wavelength conversion part 160a a mirror-like surface), a grinding or polishing process may be additionally performed as necessary.

Total transmittance of a visible light band of the wavelength conversion part 160a is preferably 90% or more, and more preferably, 95% or more. Thus, the wavelength conversion part 160a formed by sintering the mixture layer 160 of the glass composition G and the wavelength conversion material P may convert a wavelength of excitation light into a wavelength of light of a desired color, while achieving a high degree of transmittance. The wavelength conversion part 160a may have hardness sufficient to firmly support the light emitting structure 120 during the process of removing the support substrate 150, and thus, the wavelength conversion part 160a may be used as a support in separating the support substrate 150. Thus, no additional support may be required to remove the support substrate 150, so the manufacturing process is simplified.

In certain embodiments, the mixture layer 160 may include a plastic material instead of or in addition to the glass composition. In case glass composition is used in the mixture layer 160, the hardness of the wavelength conversion part may range between 4 and 7 in Mohs Scale of Hardness (MSH). In case plastic material is used in the mixture layer 160, the hardness of the wavelength conversion part may range between 0.2 and 7 in MSH scale.

In general, the light emitting structure 120 formed of a semiconductor has high refractivity, and thus, light extraction efficiency of light emitted in the air from the light emitting structure 120 may be lowered due to the difference in refractive indices. The wavelength conversion part 160a may be disposed to have a high refractive index between the refractive index of the light emitting structure 120 and the refractive index of the air to enhance external light extraction efficiency. For example, in a case in which a refractive index of GaN semiconductor is about 2.1, the wavelength conversion part 160a may have a refractive index, preferably, equal to or greater than 1.5, more preferably, equal to or greater than 1.52. Such a refractive index may be realized by the glass composition G described above.

Figure 7:
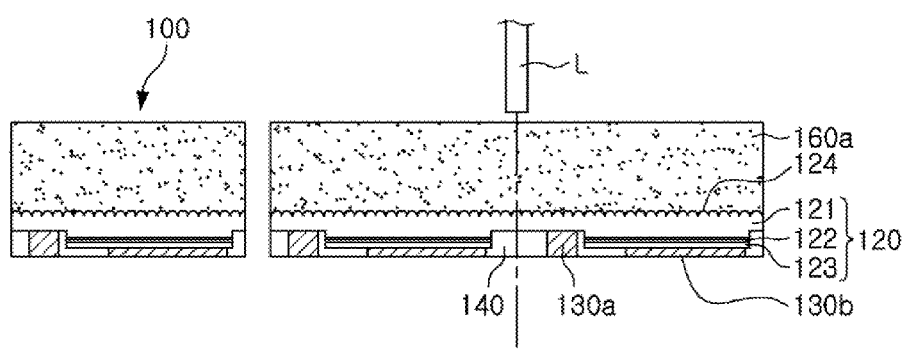

Thereafter, as illustrated in FIG. 7, the wavelength conversion part 160a and the light emitting structure 120 are cut using a laser beam L to separate the corresponding structure into an individual semiconductor light emitting devices 100. Here, however, the method of separating the structure into the individual semiconductor light emitting devices 100 is not limited thereto and a method for separating the structure using a blade or a water jet may also be applied.

Figure 8:
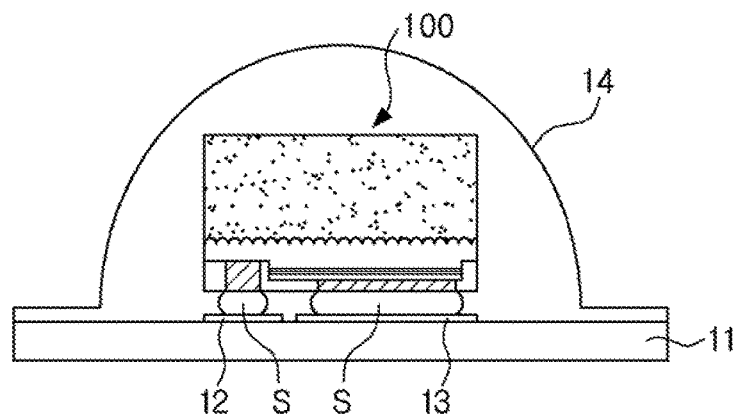

Thereafter, as illustrated in FIG. 8, the semiconductor light emitting device 100 is mounted on first and second circuit patterns 12 and 13 of a mounting board 11, and an encapsulant 14 is formed to cover the semiconductor light emitting device 100, manufacturing a semiconductor light emitting device package 10. In some examples, the encapsulant 14 may be formed of the same material as the mixture layers 160 described herein (e.g., glass or plastic containing wave length conversion part(s) 160a). In some examples, the mixture layer 160 may be formed to act as an encapsulant and avoid the need to provide separate layers for the mixture layer 160 and the encapsulant 14. Thus, in some examples, the mixture layer 160 may be an outermost layer of the semiconductor light emitting device package. The mounting board 11 may be a printed circuit board, a metal-core printed circuit board (MCPCB), a metal printed circuit board (MPCB), or a flexible printed circuit board (FPCB), and the structure of the mounting board 11 may have various forms. The semiconductor light emitting device 100 may be electrically connected to the first and second circuit patterns 12 and 13 through a conductive bonding material S. For example, the conductive bonding material may be a solder bump including Sn.

Figure 19:
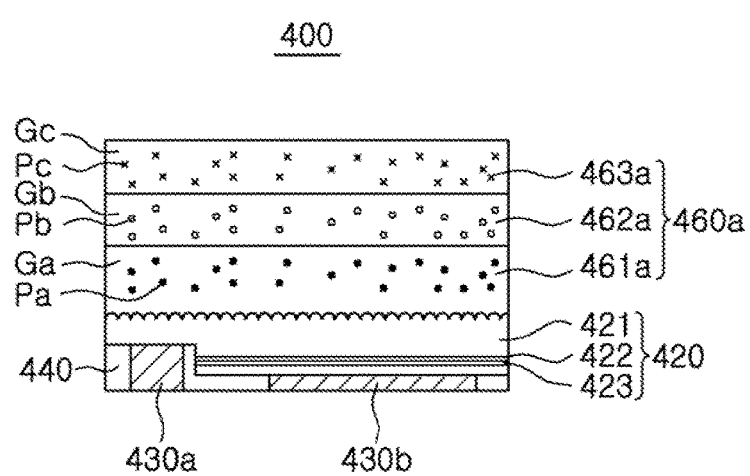
FIG. 19 is an exemplary embodiment illustrating a light conversion layer of the present inventive concept.

FIG. 19 is a view illustrating an exemplary embodiment, in which a wavelength conversion part 460a includes a plurality of layers 461a, 462a, and 463a.

The wavelength conversion part 460a including the plurality of layers 461a, 462a, and 463a may be formed by sintering the plurality of layers at a same time after configuring layers containing a mixture of a glass composition and a wavelength conversion material in each layer. The plurality of layers 461a, 462a, and 463a may contain glass compositions Ga, Gb, and Gc respectively and wavelength conversion materials Pa, Pb, and Pc respectively. The glass compositions Ga, Gb, and Gc may have different compositions from each other. The wavelength conversion materials Pa, Pb, and Pc may have different compositions from each other and act to convert light to different wavelengths from each other (e.g., different colors or different sets of colors may be emitted from each of the wavelength conversion materials Pa, Pb and Pc). In some embodiments, a portion of the plurality of layers 461a, 462a, and 463a may be formed as a layer not containing a wavelength conversion material. When the wavelength conversion part 460a is formed to include the plurality of layers 461a, 462a, and 463a, the wavelength of light may be controlled by adjusting the conversion materials included in the layers. For example, the converted wavelength may be precisely controlled by the kind and amount of the wavelength conversion materials and/or by the glass compositions along with the thicknesses of the layers. Also, since types of glass compositions included in the layers are varied, refractive indices of the layers may be varied to thus control a path of light passing through the wavelength conversion part 460a. Like the exemplary embodiment described above, a light emitting structure 420 may include a first conductivity-type semiconductor layer 421, an active layer 422, and a second conductivity-type semiconductor layer 423. First and second electrodes 430a and 430b may be formed on the first conductivity-type semiconductor layer 421 and the second conductivity-type semiconductor layer 423, respectively. An adhesive 440 is applied to one surface of the light emitting structure 420.

Hereinafter, a method for manufacturing a semiconductor light emitting device package according to another exemplary embodiment will be described. FIGS. 9 through 14 are views schematically illustrating processes in a method for manufacturing a semiconductor light emitting device package according to an embodiment of the present inventive concept.

In the present exemplary embodiment, a light emitting structure 220 is mounted on a package board 240. Hereinafter, the different portions of the present embodiment from previous embodiments will be mainly described.

Figure 9:
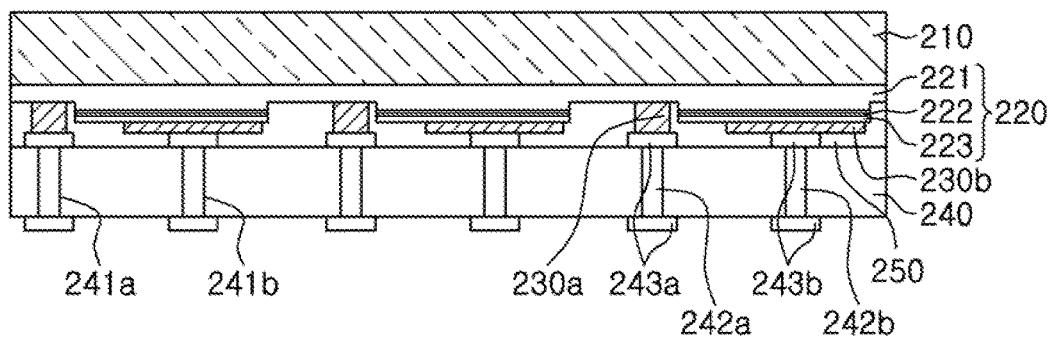
FIGS. 9 through 14 views schematically illustrating processes in a method for manufacturing a semiconductor light emitting device package according to another exemplary embodiment of the present inventive concept.

First, as illustrated in FIG. 9, similarly to the exemplary embodiment described above, a light emitting structure 220 including a first conductivity-type semiconductor layer 221, an active layer 222, and a second conductivity-type semiconductor layer 223 is formed, and the package board 240 may be attached to the light emitting structure 220. Here, an adhesive 250 may be applied to one surface of the light emitting structure 220 to which the package board 240 is attached.

First and second bonding pads 243a and 243b may be formed on the package board 240, and first and second electrodes 230a and 230b electrically connected to the first and second conductivity-type semiconductor layers 221 and 223 may be connected to the first and second bonding pads 243a and 243b, whereby the light emitting structure 220 may be mounted on the package board 240. The first and second electrodes 230a and 230b may be connected to the first and second bonding pads 243a and 243b, respectively, by a conductive bonding layer such as a solder bump, or the like, but the present inventive concept is not limited thereto.

In the package board 240, first and second via electrodes 242a and 242b may be formed in a thickness direction as shown in FIG. 9. The first and second via electrodes 242a and 242b may penetrate through the package board 240 from one surface to the other surface thereof. The first and second electrodes 230a and 230b may be electrically connected to the bonding pads 243a and 243b exposed on the lower surface of package board 240 through connections to the bonding pads 243a and 243b on the upper surface of package board 240 and the first and second via electrodes 242a and 242b.

First and second vias 241a and 241b may be formed in the package board 240. The first and second vias 241a and 241b may penetrate through the package board 240 from one surface to the other surface of the package board 240. Then the package board 240 may be attached to the light emitting structure 220. The first and second via electrodes 242a and 242b may be formed filling the first and second vias 241a and 241b with a conductive paste (note that for clarity, reference labels in FIG. 9 do not label all sets of the first and second vias 241a and 241b and first and second via electrodes 242a and 242b). In certain embodiments, the first and second via electrodes 242a and 242b may be formed by plating a conductive material in the first and second vias 241a and 241b. However, the present inventive concept is not limited thereto. For example, before the package board 240 is attached to the light emitting structure 220, the first and second via electrodes 242a and 242b may be formed in the package board 240, and thereafter, the package board 240 may be attached to the light emitting structure 220.

First and second bonding pads 243a and 243b may be formed on one surface and the other surface of the package board 240 where both ends of each of the first and second via electrodes 242a and 242b are exposed. Therefore, the bonding pads 243a and 243b are electrically connected through via electrodes 242a and 242b, and both surfaces of the package board 240 are electrically coupled to each other accordingly. The package board 240 may be a board for manufacturing a so-called wafer level package (WLP), a component completing a package in a wafer state.

As the package board 240, a board formed of a material such as silicon (Si), sapphire, ZnO, GaAs, SiC, $MgAl_2O_4$, MgO, $LiAlO_2$, $LiGaO_2$, or GaN may be used. However, a material of the package board 240 is not limited thereto and the package board 240 may be formed of a material such as an organic resin material containing epoxy, triazine, silicone, polyimide, and/or the like. Other organic resin material may be used as the package board 240 in consideration of heat dissipation characteristics and an electrical connection relationship of the semiconductor light emitting device package. In certain embodiments, in order to enhance heat dissipation characteristics and light emission efficiency, the package board 240 may be formed of a ceramic material having characteristics of high heat resistance, good heat conductivity, and high reflection efficiency, for example, a material such as $Al_2O_3$ or AlN.

A printed circuit board (PCB), a lead frame, and/or the like, may also be used as the package board 240 of the present exemplary embodiment.

Figure 10:
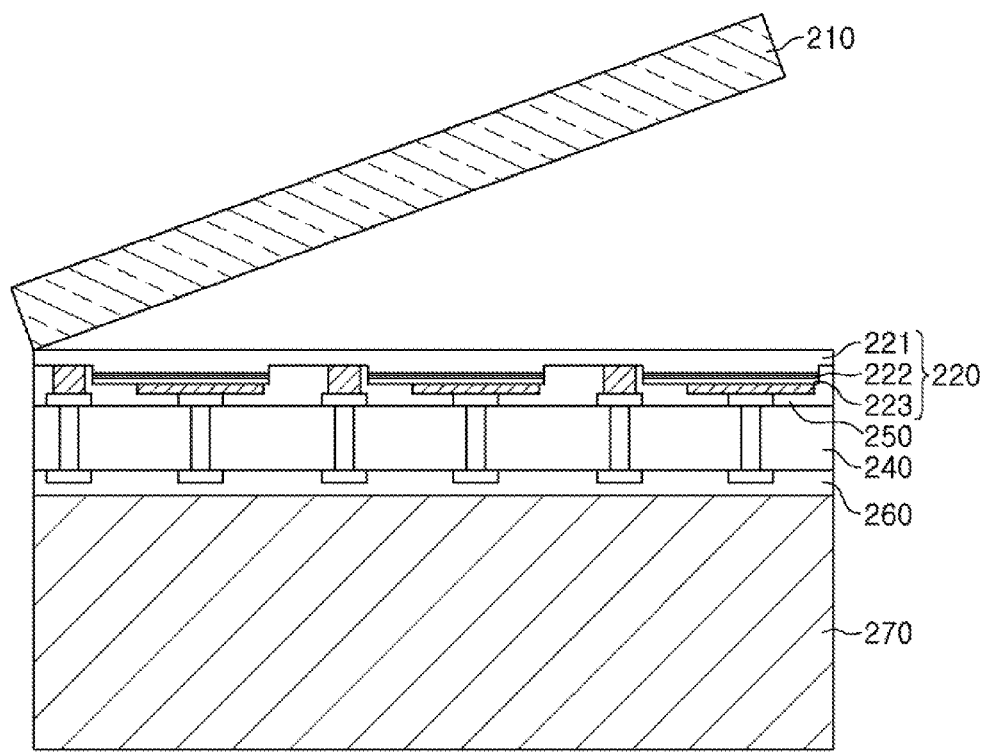

Thereafter, as illustrated in FIG. 10, a support substrate 270 may be attached to a lower portion of the package board 240 and a growth substrate 210 may be removed. Before attaching the support substrate 270, an adhesive 260 may be applied to one surface of the package board 240 to which the support substrate 270 is attached.

The support substrate 270 serves to prevent damage to the light emitting structure 220 during a following manufacturing process, and various substrates may be attached. Since the support substrate 270 serves to support the light emitting structure 220 during the process separating the growth substrate 210 from the light emitting structure 220, the growth substrate 210 may be separated from the light emitting structure 220 after the support substrate 270 is attached to the package board 240.

The growth substrate 210 may be separated from the light emitting structure 220 through a laser lift-off (LLO) process. The laser used in the LLO process may be a 193 nm excimer laser, a 248 nm excimer laser, a 308 nm excimer laser, an Nd:YAG laser, a He—Ne laser, or an argon (Ar) ion laser. In certain embodiments, the growth substrate 210 may be removed through a physical method such as grinding, polishing, or lapping.

Figure 11:
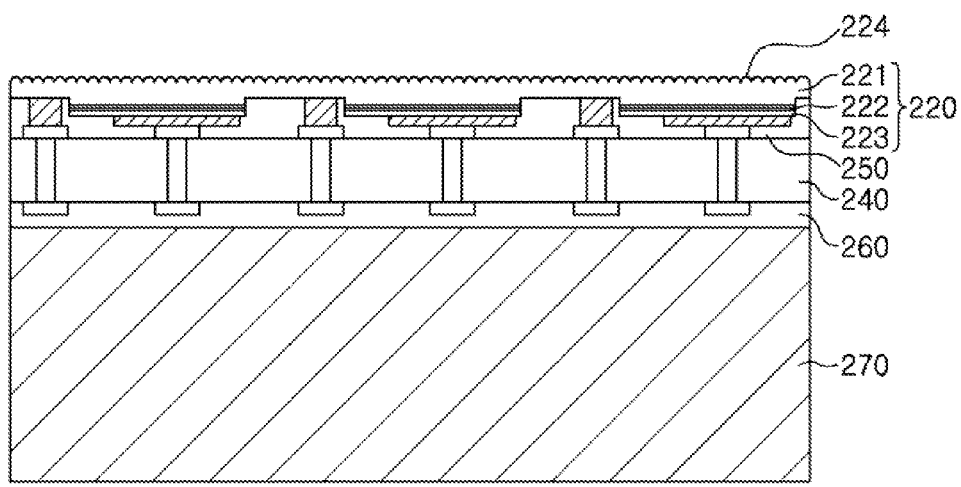

Thereafter, as illustrated in FIG. 11, similarly to the exemplary embodiment described above, an irregular pattern 224 may be formed on an exposed surface of the light emitting structure 220.

Figure 12:
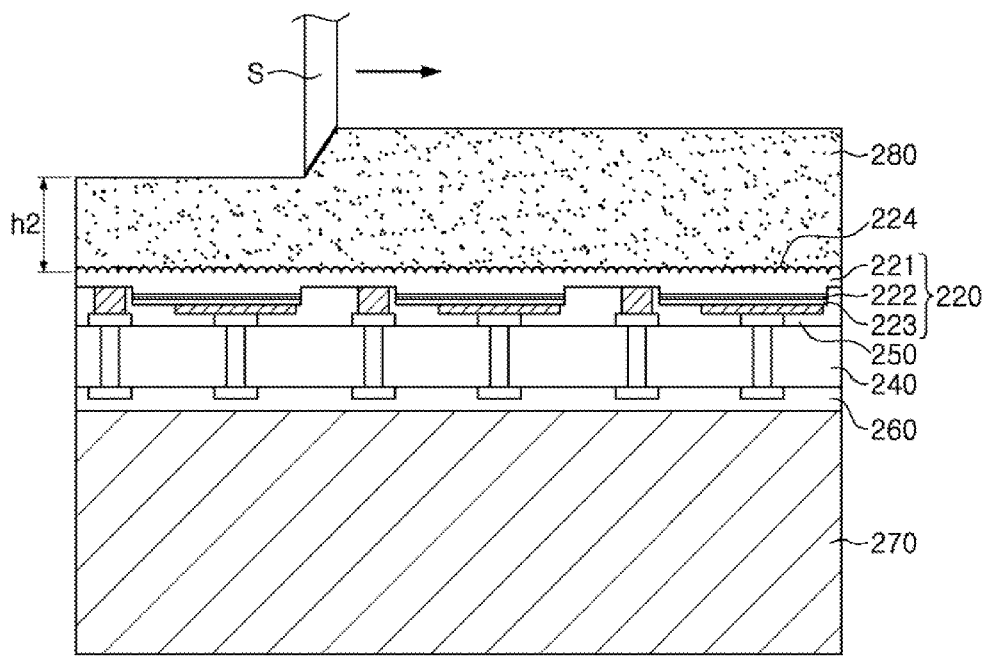

Thereafter, as illustrated in FIG. 12, similarly to the exemplary embodiment described above, a mixture layer 280 containing a wavelength conversion material and a glass composition may be formed on the light emitting structure 120. Forming of the mixture layer 280 may include preparing a mixture containing a wavelength conversion material and a glass composition, stacking the mixture on the light emitting structure 220, and shaping the same.

The thickness h2 of the mixture layer 280 may be adjusted by precisely controlling the application amount of the mixture. The thickness h2 of the mixture layer 280 may be adjusted by using a squeegee S as necessary. The thickness h2 may have the same relative thickness with the remainder of the structure shown in FIG. 12 as described herein with respect to thickness h1 (e.g., in connection with FIG. 5). During this process, a surface of the mixture layer 280 may be planarized.

Figure 13:
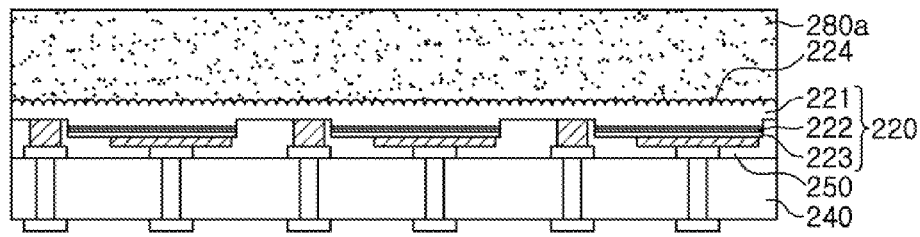
Figure 13:
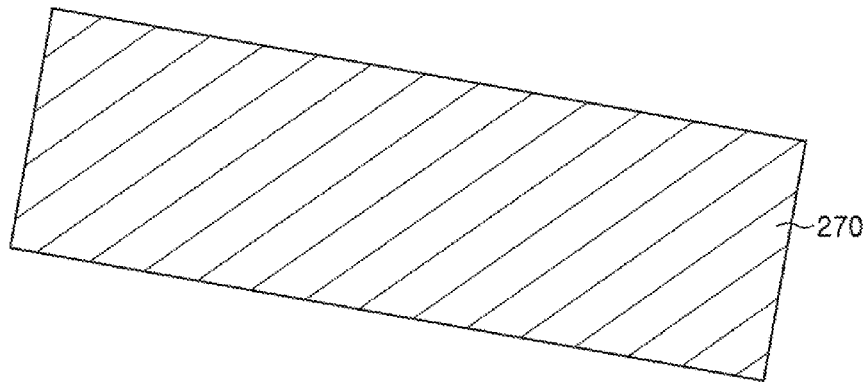

Thereafter, as illustrated in FIG. 13, similarly to the exemplary embodiment describe above, the mixture layer 280 is sintered at low temperatures to form a wavelength conversion part 280a having a desired shape, and the support substrate 270 may be subsequently removed.

The sintering of the mixture layer 280 may be performed at a low temperature at which the wavelength conversion material is not degraded. In order to process the wavelength conversion part 280a to have a desired thickness or in order to smooth the surface of the wavelength conversion part 280a (i.e., in order to make the surface of the wavelength conversion part 280a a mirror-like surface), a grinding or polishing process may be additionally performed as necessary.

Figure 14:
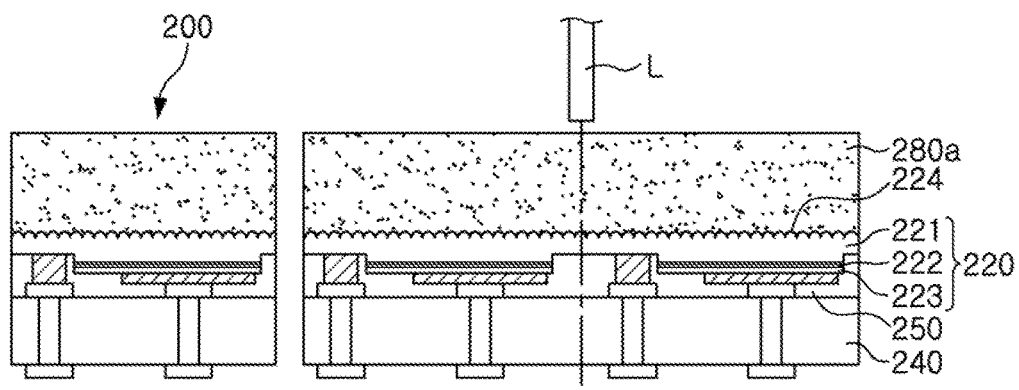

Thereafter, as illustrated in FIG. 14, similarly to the exemplary embodiment describe above, the wavelength conversion part 280a, the light emitting structure 220, and the package board 240 are cut using a laser beam L to separate the corresponding structure into an individual semiconductor light emitting device 200. Here, however, the method of separating the structure into the individual semiconductor light emitting device 200 is not limited thereto and a method for separating the structure using a blade or a water jet may also be applied.

Thereafter, an encapsulant is formed to cover the semiconductor light emitting device 200, manufacturing a semiconductor light emitting device package.

Hereinafter, a method for manufacturing a light emitting device package according to another exemplary embodiment of the present inventive concept will be described. FIGS. 15 through 18 are views schematically illustrating processes in a method for manufacturing a semiconductor light emitting device package according to another exemplary embodiment of the present inventive concept.

This exemplary embodiment may be applied after the process (please refer to FIG. 11) of forming the irregular pattern on the exposed surface of the light emitting structure according to the embodiments described above, and thus, redundant descriptions will be omitted, and processes after FIG. 11 will be described.

Figure 15:
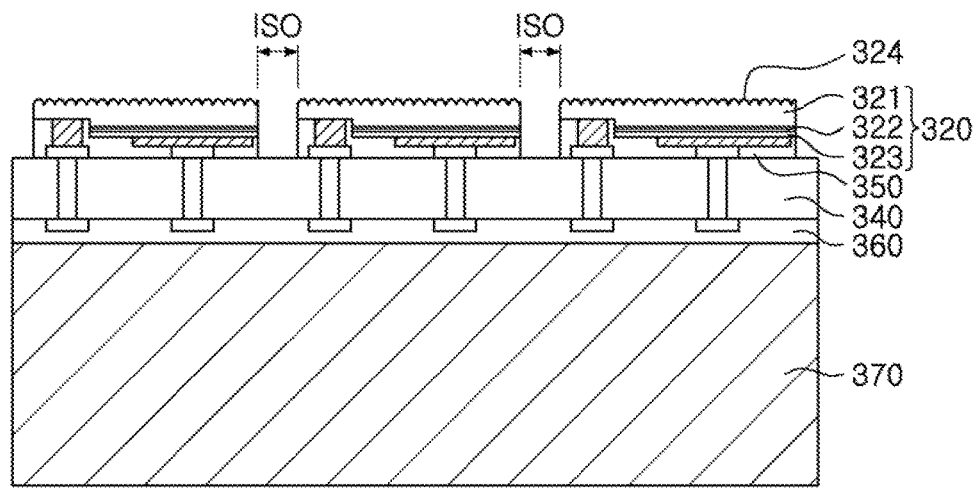
FIGS. 15 through 18 are views schematically illustrating processes in a method for manufacturing a semiconductor light emitting device package according to another exemplary embodiment of the present inventive concept.

First, referring to FIG. 15, similarly to the exemplary embodiments described above, a package board 340 may be attached to a lower portion of a light emitting structure 320 including a first conductivity-type semiconductor layer 321, an active layer 322, and a second conductivity-type semiconductor layer 323. Here, an adhesive 350 may be applied to one surface of the light emitting structure 320 to which the package board 340 is attached. A support substrate 370 may be attached to a lower portion of the package board 340. Here, an adhesive 360 may be applied to one surface of the package board 340 to which the support substrate 370 is attached. One region of the light emitting structure 320 may be etched to form an isolation region ISO to which the package board 340 is exposed.

Figure 16:
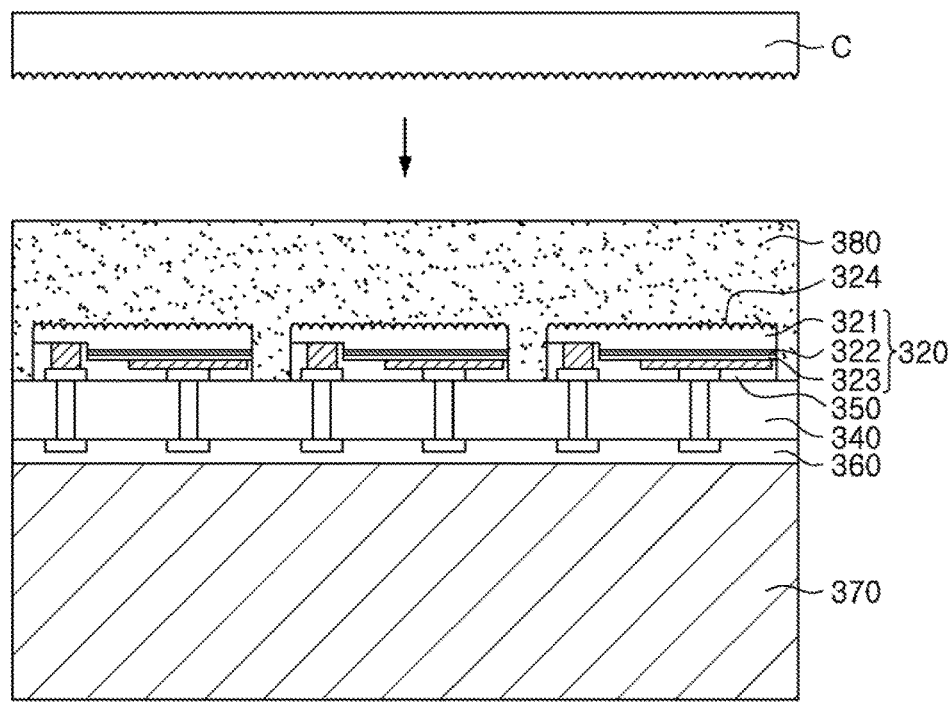

Thereafter, as illustrated in FIG. 16, similarly to the exemplary embodiment described above, a mixture layer 380 may be formed on the light emitting structure 320. The forming of the mixture layer 380 may include preparing a mixture containing a wavelength conversion material and a glass composition, stacking the mixture on the light emitting structure 320, and shaping the same. Here, the isolation region ISO from which the light emitting structure 320 was removed may also be filled with the mixture. The preparing of the mixture is the same as that described above in other exemplary embodiments, and thus, a detailed description thereof will be omitted.

In the present exemplary embodiment, unlike the exemplary embodiments described above, the mixture is stacked on the light emitting structure 320 and shaped using a stamp (or a mold) C. The stamp C has an irregular pattern formed by intaglioing one surface thereof. By pressing the surface of the stamp C with the irregular pattern formed thereon to a surface of the mixture layer 380, an irregular pattern may be formed on the surface of the mixture layer 380. Thus, an irregular pattern may be formed on a surface of a wavelength conversion part 380a in a following process forming the wavelength conversion layer 380a by sintering the mixture layer 380.

Figure 17:
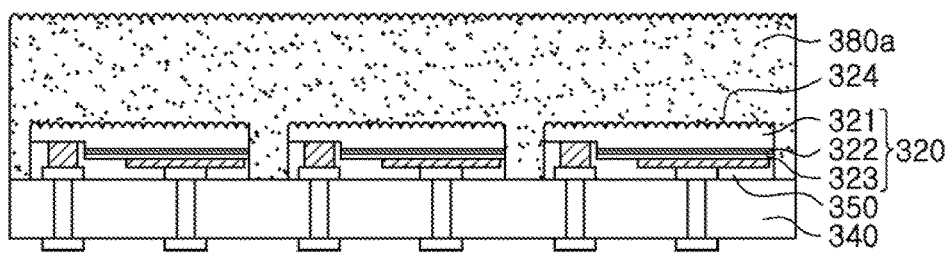
Figure 17:
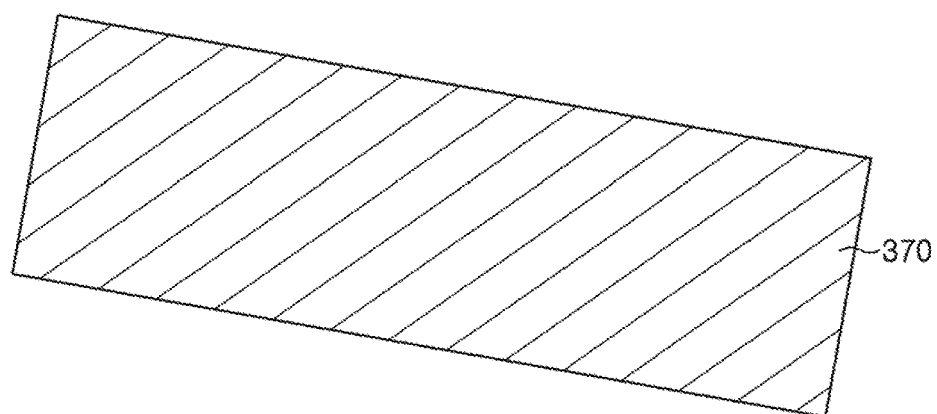

Thereafter, as illustrated in FIG. 17, similarly to the embodiments described above, the mixture layer 380 is sintered at low temperature to form a wavelength conversion part 380a having a desired shape, and the support substrate 370 may be subsequently removed. The sintering of the mixture layer 380 may be performed at low temperatures at which the wavelength conversion material is not degraded. In order to process the wavelength conversion part 380a to have a desired thickness or in order to smooth a surface of the wavelength conversion part 380a (i.e., in order to make the surface of the wavelength conversion part 160a a mirror-like surface), a grinding or polishing process may be additionally performed as necessary.

Figure 18:
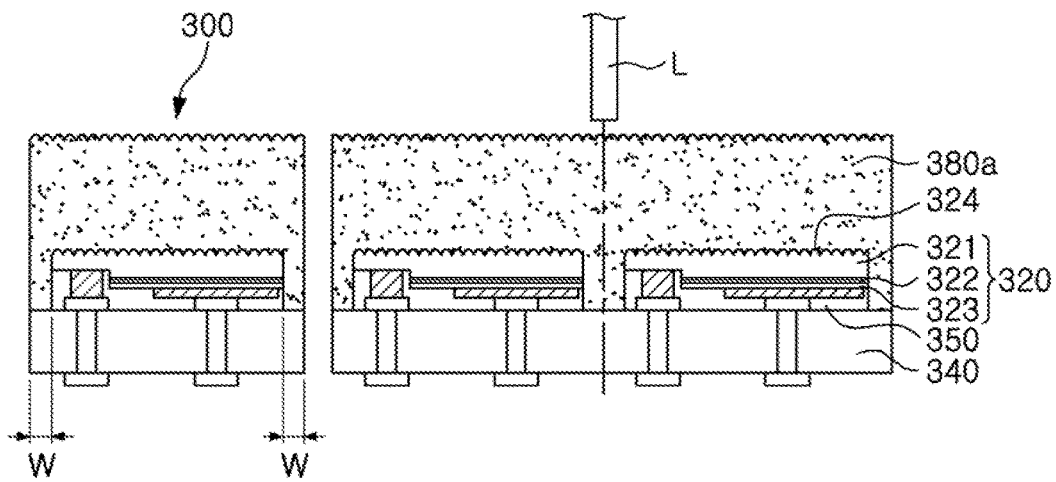

Thereafter, as illustrated in FIG. 18, similarly to the embodiments described above, the wavelength conversion part 380a and the package board 340 are cut using a laser beam L to separate the corresponding structure into an individual semiconductor light emitting device 300. Here, however, the method of separating the structure into the individual semiconductor light emitting device 300 is not limited thereto and a method for separating the structure using a blade or a water jet may also be applied. The wavelength conversion part 380a according to the present exemplary embodiment may have a predetermined thickness W on the sides of the light emitting structure 320, having a cap structure covering the light emitting structure 320. Thus, even light emitted from the sides of the light emitting structure 320 may also be converted into a predetermined light spectrum.

Thereafter, similarly to the embodiments described above, an encapsulant is formed to cover the semiconductor light emitting device 300, manufacturing a semiconductor light emitting device package.

Figure 20:
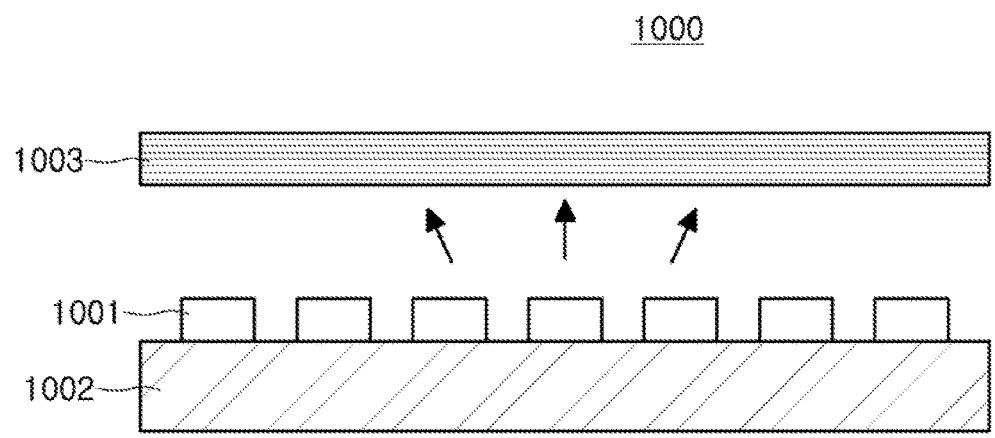
FIGS. 20 and 21 are views illustrating examples of backlight units employing a semiconductor light emitting device package according to an exemplary embodiment of the present disclosure.
Figure 21:
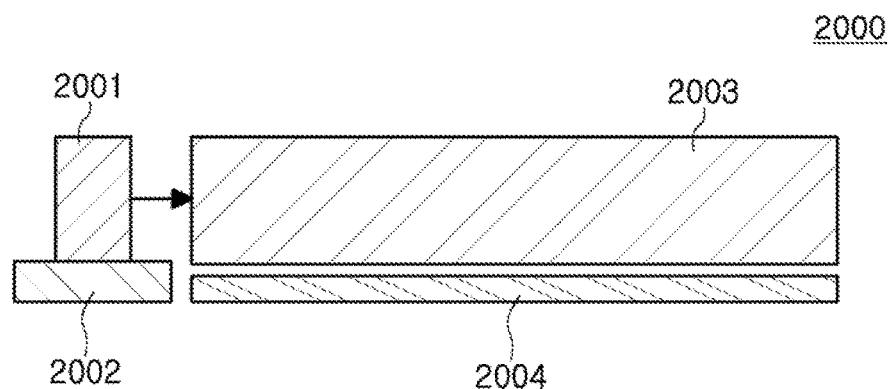

FIGS. 20 and 21 are views illustrating examples of a backlight unit employing a semiconductor light emitting device package according to an exemplary embodiment of the present inventive concept.

Referring to FIG. 20, a backlight unit 1000 includes at least one light source 1001 mounted on a substrate 1002 and at least one optical sheet 1003 disposed above the light source 1001. A semiconductor light emitting device described above or a package having a semiconductor light emitting device described above may be used as the light source 1001.

Unlike the backlight unit 1000 illustrated in FIG. 1n which the light source 1001 may emit light toward a liquid crystal display (LCD) disposed thereabove, a backlight unit 2000 as another example illustrated in FIG. 21 may be configured such that a light source 2001 mounted on a substrate 2002 may emit light in a lateral direction, and the emitted light may be incident to a light guide plate 2003, whereby the backlight unit 2000 may serve as a planar light source. The light travelling to the light guide plate 2003 may be emitted upwards, and in order to enhance light extraction efficiency, a reflective layer 2004 may be disposed below the light guide plate 2003.

Figure 22:
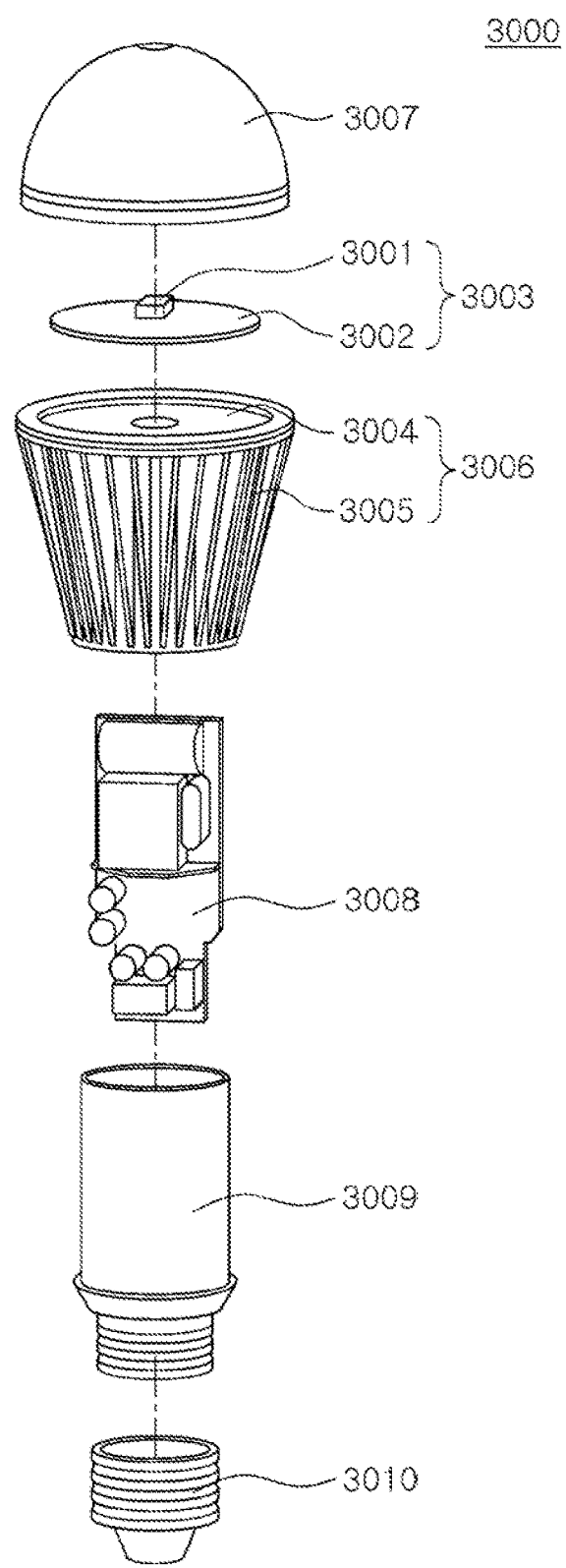
FIG. 22 is a view illustrating an example of a lighting device employing a semiconductor light emitting device package according to an exemplary embodiment of the present disclosure.

FIG. 22 is an exploded perspective view illustrating an example of a lighting device including a semiconductor light emitting device package according to an exemplary embodiment in the present inventive concept.

In FIG. 22, a lighting device 3000 is illustrated as a light bulb, and may include a light emitting module 3003, a driving unit 3008, and an external connection unit 3010.

The lighting device 3000 may further include external structures such as external and internal housings 3006 and 3009 and a cover 3007. The light emitting module 3003 may include a light source 3001 having a semiconductor light emitting device package described above or a structure similar thereto, and a circuit board 3002 on which the light source 3001 is mounted. For example, each of the first and second electrodes of the semiconductor light emitting device may be electrically connected to an electrode pattern of the circuit board 3002. In the present exemplary embodiment, a single light source 3001 is mounted on the circuit board 3002, but a plurality of light sources may be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the lateral surfaces of the lighting device 3000. The cover 3007 may be installed on the light emitting module 3003 and have a convex lens shape. The driving unit 3008 may be installed in the internal housing 3009 and connected to the external connection unit 3010 having a socket structure to receive power from an external power source. Also, the driving unit 3008 may serve to convert the received power into a power appropriate for driving the light source 3001 of the light emitting module 3003, and provide the converted power thereto. For example, the driving unit 3008 may be provided as an AC-DC converter, a rectifying circuit, or the like.

Figure 23:
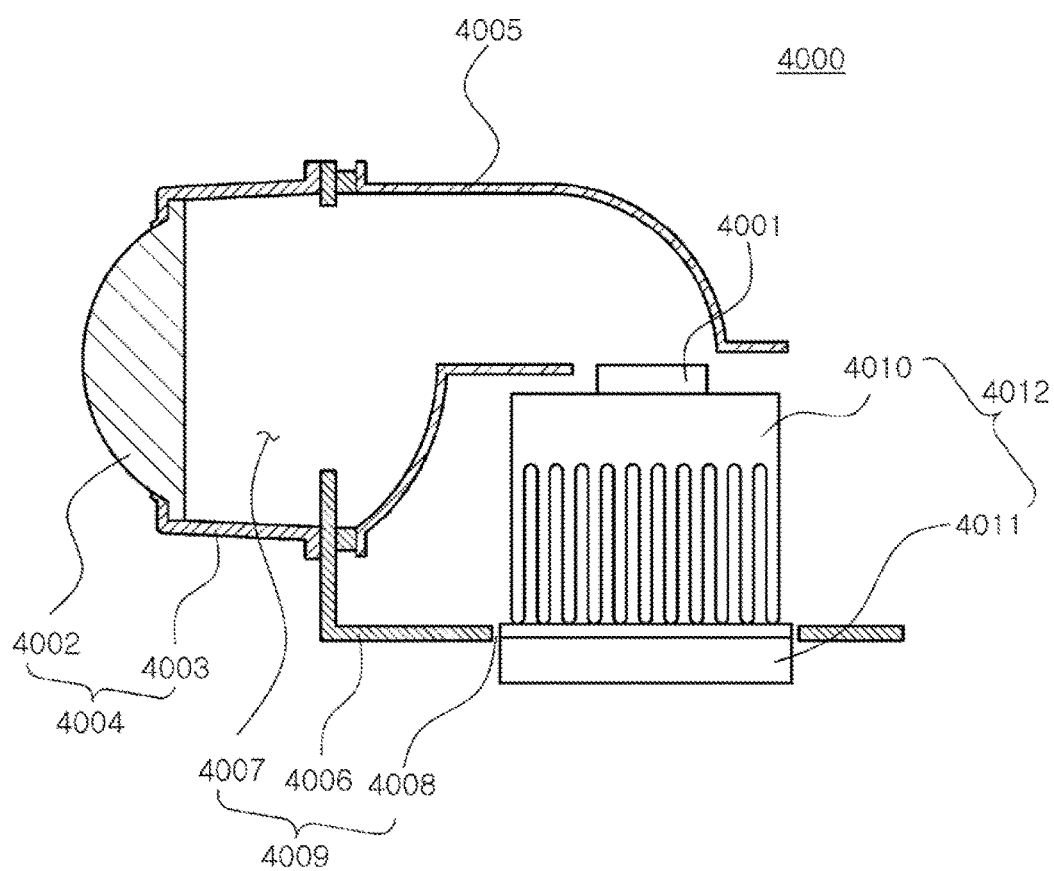
FIG. 23 is a view illustrating an example of a headlamp employing a semiconductor light emitting device according to an exemplary embodiment of the present disclosure.

FIG. 23 is a view illustrating an example of a headlamp including a semiconductor light emitting device package according to an exemplary embodiment in the present inventive concept.

Referring to FIG. 23, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include a semiconductor light emitting device package described above.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may include a body 4006 and a central hole 4008 formed in one surface thereof, to which the heat dissipation unit 4012 is coupled.

The housing 4009 may have a front hole 4007 formed in another surface integrally connected to the one surface. The front hole 4007 may be bent in a right angle direction. The reflective unit 4005 may be fixed to one surface of the housing 4009 so as to be positioned above the light source 4001. Accordingly, light generated in the light source 4001 may be reflected by the reflective unit 4005 and pass through the front hole 4007 so as to be output outwardly.

As set forth above, by the method for manufacturing a semiconductor light emitting device package according to exemplary embodiments of the present inventive concept, the manufacturing cost of the semiconductor light emitting device package may be reduced and the manufacturing time may be reduced since the light conversion mixture layer is formed of wavelength conversion material and glass composition.

The foregoing is illustrative of example embodiments and is not to be construed as limiting thereof. Although a few example embodiments have been described, it will be apparent to those skilled in the art that modifications and variations could be made without departing from the scope of the invention as defined by the appended claims.

What is claimed is:

1. A method of manufacturing a semiconductor light emitting device package, the method comprising:
   disposing a plurality of light emitting structures, each including a first conductivity-type semiconductor layer, an active layer, and a second conductivity-type semiconductor layer on a support substrate;
   shaping a mixture containing a wavelength conversion material and a glass composition on the plurality of light emitting structures;
   sintering the mixture to form a wavelength conversion part after the shaping the mixture containing the wavelength conversion material and the glass composition on the plurality of light emitting structures;
   removing the support substrate; and
   cutting the plurality of light emitting structures into individual device units.

2. The method of claim 1, wherein the glass composition is prepared by adding at least one component selected from the group consisting of $Na_2O$, $CaO$, $K_2O$, and $Li_2O$ to a $ZnO$—$BaO$—$SiO_2$—$P_2O_5$—$B_2O_3$-based glass material.

3. The method of claim 1, wherein, in the shaping of the mixture, the mixture is disposed on the plurality of light emitting structures in the form of a sheet.

4. The method of claim 3, further comprising: prior to the step of sintering the mixture, reducing a thickness of the mixture disposed on the plurality of light emitting structures to a predetermined thickness.

5. The method of claim 3, wherein the mixture is disposed in a manner in which a plurality of sheets is stacked.

6. The method of claim 5, wherein the plurality of sheets contains different wavelength conversion materials.

7. The method of claim 1, wherein, in the shaping of the mixture, the mixture fills to cover sides of the plurality of light emitting structures.

8. The method of claim 7, wherein, in the cutting of the plurality of light emitting structures, the wavelength conversion part is cut such that the sides of the active layer are not exposed.

9. The method of claim 1, further comprising: forming an irregular pattern on a surface of the mixture using a mold, before the sintering of the mixture to form the wavelength conversion part.

10. The method of claim 1, further comprising: forming an irregular pattern on surfaces of the plurality of light emitting structures, before the shaping of the mixture containing the wavelength conversion material and the glass composition on the plurality of light emitting structures.

11. The method of claim 1, further comprising: stacking the plurality of light emitting structures, each including the first conductivity-type semiconductor layer, the active layer, and the second conductivity-type semiconductor layer on a growth substrate, before the disposing of the plurality of light emitting structures including the first conductivity-type semiconductor layer, the active layer, and the second conductivity-type semiconductor layer on the support substrate.

12. The method of claim 11, further comprising: separating the growth substrate from the plurality of light emitting structures, before the sintering of the mixture to form the wavelength conversion part.

13. The method of claim 12, wherein, in the separating of the growth substrate from the plurality of light emitting structures, the growth substrate is separated from the first conductivity-type semiconductor layer.

14. A method of manufacturing a semiconductor light emitting device package, the method comprising:
- disposing a plurality of light emitting structures, each including a first conductivity-type semiconductor layer, an active layer, and a second conductivity-type semiconductor layer on a support substrate;
- shaping a mixture containing a wavelength conversion material and a glass composition while the mixture is on one surface of each light emitting structure of the plurality of light emitting structures;
- removing the support substrate from the plurality of light emitting structures after the shaping the mixture containing the wavelength conversion material and the glass composition on the one surface of each light emitting structure; and
- removing at least portions of the light emitting structures to separate the light emitting structures.

15. The method of claim 14, wherein the disposing of the plurality of light emitting structures on the support substrate comprises:
- forming the plurality of light emitting structures on a growth substrate;
- forming first and second electrodes on first surfaces of the plurality of light emitting structures on which the second conductivity-type semiconductor layers are formed, such that the first and second electrodes are connected to the first and second conductivity-type semiconductor layers, respectively;
- attaching the support substrate to the first surfaces of the plurality of light emitting structures; and
- removing the growth substrate.

16. The method of claim 14, further comprising attaching a package board to the plurality of light emitting structures,
- wherein the package board is electrically connected to the plurality of light emitting structures,
- wherein the removing of at least portions of the light emitting structures exposes a portion of the package board and separate the light emitting structures from each other,
- wherein the mixture is formed on the exposed portion of the package board.

17. The method of claim 1, wherein a thickness of the mixture is greater than a thickness of the light emitting structures.

18. The method of claim 1, further comprising:
- forming an irregular pattern on surfaces of the plurality of light emitting structures before the shaping of the mixture containing the wavelength conversion material and the glass composition on the plurality of light emitting structures,
- wherein the irregular pattern contacts the mixture and a boundary surface between the mixture and the plurality of light emitting structures has an irregular pattern in a cross-sectional view,
- wherein the method further comprises packaging at least one of the individual device units after the cutting the plurality of light emitting structures into individual device units.

19. A method for manufacturing a semiconductor light emitting device package, the method comprising:
- forming a plurality of light emitting structures, each including a first conductivity-type semiconductor layer, an active layer, and a second conductivity-type semiconductor layer on a semiconductor substrate;
- disposing a support substrate on a first surface of the plurality of light emitting structures;
- removing the semiconductor substrate to expose a second surface of the plurality of light emitting structures;
- forming a pattern on the second surface of the plurality of light emitting structures to provide a patterned second surface of the plurality of light emitting structures;
- depositing a mixture containing a wavelength conversion material and a glass composition on at least a portion of the patterned second surface of the plurality of light emitting structures so that a bottom surface of the mixture facing the patterned second surface has a shape that conforms to a shape of the patterned second surface;
- after depositing the mixture, sintering the mixture while the mixture is on the plurality of light emitting structures to form a wavelength conversion part;
- removing the support substrate; and
- cutting the plurality of light emitting structures into individual device units.

20. The method of claim 19, further comprising, after depositing the mixture on at least a portion of the patterned second surface of the plurality of light emitting structures and prior to sintering the mixture, altering a shape of a top surface of the mixture opposite the bottom surface of the mixture.

* * * * *